(12) United States Patent
Matsubara (10) Patent No.: US 7,558,135 B2
(45) Date of Patent: Jul. 7, 2009

(54) SEMICONDUCTOR MEMORY DEVICE AND TEST METHOD THEREOF (75) Inventor: Yasushi Matsubara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 43 days.

(21) Appl. No.: 11/745,051

(22) Filed: May 7, 2007

(65) Prior Publication Data
US 2007/0268776 A1 Nov. 22, 2007

(30) Foreign Application Priority Data
May 22, 2006 (JP) ............... 2006-141041

(51) Int. Cl.
G11C 7/00 (2006.01)
G11C 29/00 (2006.01)
(52) U.S. Cl. ............... 365/201; 365/233.1; 365/230.03
(58) Field of Classification Search ................ 365/201, 365/233.1, 230.03
See application file for complete search history.

(56) References Cited

U.S. PATENT DOCUMENTS

| 6,078,536 | A | 6/2000 | Moon et al. | |
|---|---|---|---|---|
| 6,272,586 | B1* | 8/2001 | Roohparvar et al. | 711/103 |
| 6,275,961 | B1* | 8/2001 | Roohparvar | 714/718 |
| 6,333,879 | B1* | 12/2001 | Kato et al. | 365/201 |
| 6,424,142 | B1* | 7/2002 | Kato et al. | 324/158.1 |
| 6,813,203 | B2* | 11/2004 | Nakagawa | 365/201 |
| 6,868,020 | B2* | 3/2005 | Aoki | 365/200 |
| 6,870,783 | B2* | 3/2005 | Kwak et al. | 365/201 |
| 6,999,356 | B2* | 2/2006 | Kozuka et al. | 365/189.09 |
| 7,345,929 | B2* | 3/2008 | Kajigaya et al. | 365/189.02 |
| 7,362,622 | B2* | 4/2008 | Braun et al. | 365/189.09 |

FOREIGN PATENT DOCUMENTS

| JP | 7141041 A | 6/1995 |
|---|---|---|
| JP | 11176196 A | 7/1999 |
| JP | 2003-307545 A | 10/2003 |
| JP | 2004-046927 A | 2/2004 |
| JP | 2004-071098 A | 3/2004 |
| JP | 2004-198367 A | 7/2004 |

* cited by examiner

Primary Examiner—Huan Hoang
(74) Attorney, Agent, or Firm—Sughrue Mion, PLLC (57) ABSTRACT When a predetermined code is set to a mode register, a switching signal generating circuit is activated, and a switching signal TCLKE becomes at a high level. When the switching signal TCLKE becomes at a high level, input data supplied from a data input and output terminal DQ is used as an internal clock ICLK. Accordingly, during a test in a wafer state, a clock signal can be received from the data input and output terminal DQ, even when a clock terminal, an address terminal, and a command terminal are connected in common to plural semiconductor memory devices. Therefore, a code for artificially performing a fine adjustment of a reference voltage can be individually supplied for each chip.

18 Claims, 8 Drawing Sheets

| ... | -0.03V | -0.02V | -0.01V | ±0V | +0.01V | +0.02V | +0.03V | ... |
|---|---|---|---|---|---|---|---|---|
| ... | CODE A | CODE B | CODE C | CODE D | CODE E | CODE F | CODE G | ... |
| ... | Chip(5,2) Chip(6,4) | Chip(1,4) Chip(4,4) | Chip(2,2) Chip(3,1) | Chip(1,2) Chip(3,4) | Chip(3,3) Chip(4,3) | Chip(1,5) Chip(6,6) | Chip(4,5) Chip(5,5) | ... |
| . . . . . | . . . | . . . | . . . | . . . | . . . | . . . | . . . | . . . . . |

SEMICONDUCTOR MEMORY DEVICE AND TEST METHOD THEREOF

TECHNICAL FIELD

The present invention relates to a semiconductor memory device and a test method thereof, and, more particularly to a semiconductor memory device and a test method thereof capable of temporarily adjusting an internally-generated reference voltage.

BACKGROUND OF THE INVENTION

In a manufacturing process of a semiconductor memory device such as a DRAM (Dynamic Random Access Memory), various kinds of operation tests are performed in a wafer state in many cases. In the operation test, a defective address at which data reading or data writing cannot be performed is detected. A detected defective address is saved by a redundant cell. The defective cell is replaced by the redundant cell mainly by the trimming of a fuse.

The operation test in the wafer state is not performed for each chip, and is generally performed for plural chips in parallel. In other words, by commonly connecting a clock terminal, an address terminal, and a command terminal among plural chips to be tested, a common clock signal, a common address signal, and a common command are given to these chips. In this state, data are actually read and written. Because at least the output data needs to be individually handled for each chip, it should be understood that data input and output terminals are not connected in common.

However, at this state of the operation test, fine adjustment of a reference voltage generated inside the chip is not completed, and a correct test cannot be performed in this state. Therefore, conventionally, a reference voltage generated inside the chip is temporarily applied from the outside, and the operation test is performed in this state. A reference voltage applied from the outside is substantially equal to a design value, and the operation test can be performed substantially in the design condition.

However, the reference voltage applied from the outside does not completely coincide with the original reference voltage obtained after the fine adjustment. In other words, even when the reference voltage is fine-adjusted to become close to the design value, the value close to the design value cannot always be obtained for various reasons. Therefore, according to the method of externally applying a reference voltage equal to the design value, the original state of the device after the fine adjustment cannot be correctly realized.

Consequently, according to the conventional method, the operation test is performed in a state of using a reference voltage a little different from the original reference voltage obtained after the fine adjustment. This decreases the accuracy of the operation test. However, a deviation from the reference voltage in the operation test is small, and therefore, the accuracy of the operation test does not decrease substantially. When a voltage reduction and a density increase of the semiconductor memory device further progress, the accuracy of the operation test decreases to an unnegligible degree due to a slight deviation of the reference voltage.

In order to solve the above problems, there might be a method that a reference voltage is fine-adjusted by fuse trimming, and thereafter, an operation test of detecting a defective address is performed. According to this method, however, after detecting a defective address, a cell needs to be replaced again by a redundant cell by fuse trimming. In other words, two trimming processes are necessary. Therefore, manufacturing cost increases, and, moreover, damage applied to the electrode pad increases, resulting in a reduction of reliability.

As another method of solving the above problems, a code for temporarily performing the fine adjustment of a reference voltage is input in the test mode, and an operation test of detecting a defective address is performed in this state. However, the entry to this test mode requires the input of a predetermined code from an address terminal in a state that a mode register set (MRS) command is issued. Therefore, individual codes cannot be input to chips to be tested. It is of course possible to configure such that individual addresses are input to chips to be tested, without connecting an address terminal in common to the chips. In this case, a tester becomes substantially complex.

Techniques described in Japanese Patent Application Laid Open Nos. 2003-307545, 2004-46927, 2004-198367, and 2004-71098 are also known, as other conventional techniques regarding the test of a semiconductor memory device.

SUMMARY OF THE INVENTION

As described above, according to the conventional semiconductor memory device, it has been difficult to perform the operation test using an original reference voltage obtained after a fine adjustment. Therefore, it is an object of the present invention to provide a semiconductor memory device and a test method thereof capable of performing an operation test using the original reference voltage obtained after a fine adjustment, without substantially complicating a tester.

The present invention provides a semiconductor memory device capable of receiving at least an address signal and a command synchronously with a clock signal. The semiconductor memory device includes; a data input and output terminal; a clock terminal to which a clock signal is input; an address terminal to which an address signal is input; a command terminal to which a command is input; and a switching unit which enables any one of a clock signal, an address signal, and a command to be received from the data input and output terminal.

The present invention provides a method of testing a semiconductor memory device, for performing an operation test of plural semiconductor memory devices, each having a data input and output terminal, a clock terminal, an address terminal, and a command terminal, in a state that the clock terminal, the address terminal, and the command terminal are connected in common among the plural semiconductor memory devices. The test method includes: a first step of measuring a reference voltage generated inside the semiconductor memory device; a second step of generating a code for temporarily adjusting a reference voltage, based on a result of measuring the reference voltage; a third step of entering a test mode capable of receiving any one of a clock signal, an address signal, and a command from the data input and output terminal; and a fourth step of supplying a code via the data input and output terminal or the address terminal, in a state of entering the test mode.

According to the present invention, in performing a test in a wafer state, any one of a clock signal, an address signal, and a command can be received from a data input and output terminal, even when a clock terminal, an address terminal, and a command terminal are connected in common among plural semiconductor memory devices. Therefore, codes for artificially performing a fine adjustment of a reference voltage can be individually supplied for each chip.

In other words, when a clock signal can be received from the data input and output terminal, a clock signal that becomes a trigger of fetching a command and a code can be selectively supplied to a chip to which a predetermined code should be input. Accordingly, an artificial fine adjustment can be performed to each chip. When an address signal can be received from the data input and output terminal, a predetermined code can be input to a chip to which the code is to be input, from the data input and output terminal. In this case, a fine adjustment can be artificially performed to each chip. When a command can be received from the input and output terminal, a command can be input to a chip to which the predetermined code is to be input, from the data input and output terminal. In this case, a fine adjustment can be also artificially performed to each chip.

According to the present invention, when plural semiconductor memory devices are tested in parallel by connecting all terminals in common excluding the data input and output terminal, the original reference voltage obtained after the fine adjustment can be artificially internally generated. Therefore, the operation test can be performed correctly, without substantially complicating the tester.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
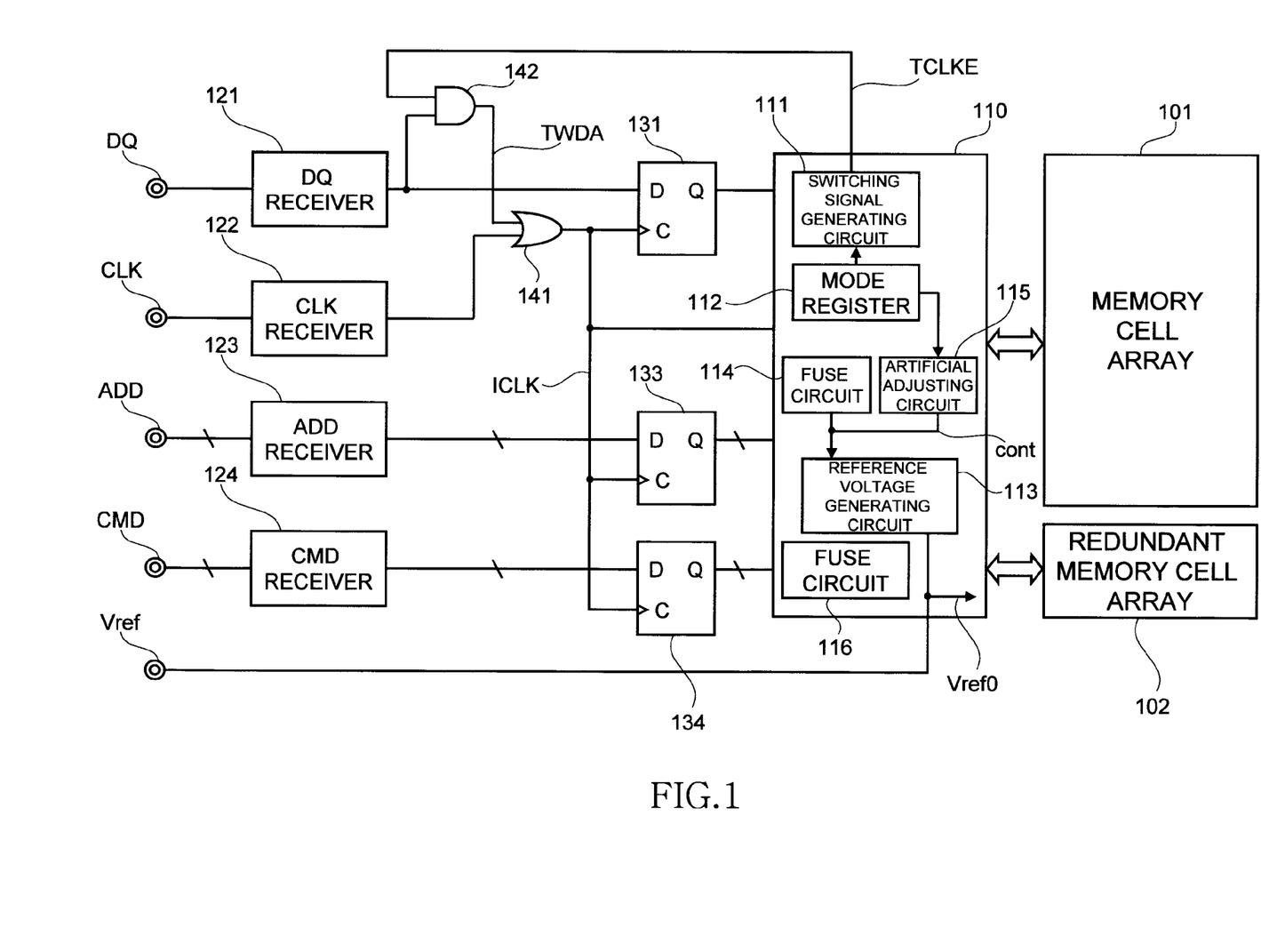
FIG. 1 shows a configuration of main parts of a semiconductor memory device according to a preferred embodiment of the present invention.

FIG. 1 shows a configuration of main parts of a semiconductor memory device according to a preferred embodiment of the present invention.

The semiconductor memory device according to the present embodiment is a one that performs an operation synchronously with a clock signal, such as a synchronous DRAM. As shown in FIG. 1, the semiconductor memory device includes a data input and output terminal DQ that inputs and outputs data, a clock terminal CLK to which a clock signal is supplied, an address terminal ADD to which an address signal is supplied, and a command terminal CMD to which a command is supplied. A number of the data input and output terminal DQ is one (x1) in the present embodiment, although this number is different depending on a data input and output width. The command terminal CMD is a terminal group including a RAS terminal, a CAS terminal, a WE terminal, and a CS terminal.

The data input and output terminal DQ, the clock terminal CLK, the address terminal ADD, and the command terminal CMD are connected to a DQ receiver 121, a CLK receiver 122, an ADD receiver 123, and a CMD receiver 124, respectively. Signals supplied from the terminals are supplied to the inside via the corresponding receivers 121 to 124.

Outputs from the DQ receiver 121, the ADD receiver 123, and the CMD receiver 124 are supplied to data input terminals D of a DQ latch 131, an ADD latch 133, and a CMD decoder 134, respectively. The DQ latch 131, the ADD latch 133, and the CMD decoder 134 fetch data synchronously with an internal clock ICLK supplied to a clock input terminal C, and output the fetched data from a data output terminal Q. Outputs from the DQ latch 131, the ADD latch 133, and the CMD decoder 134 are supplied to a peripheral circuit unit 110.

On the other hand, an output from the CLK receiver 122 is supplied to one input terminal of an OR gate 141. An output from the OR gate 141 is used as the internal clock ICLK, and is supplied to the DQ latch 131, the ADD latch 133, and the CMD decoder 134, and is also supplied to the peripheral circuit unit 110 for use as a timing signal of the peripheral circuit unit 110.

An internal signal TWDA as an output of an AND gate 142 is supplied to the other input terminal of the OR gate 141. As shown in FIG. 1, an output signal of the DQ receiver 121 and a switching signal TCLKE are supplied to an input terminal of the AND gate 142. The switching signal TCLKE is usually at a low level, and therefore, the output of the AND gate 142 is usually fixed to the low level. Accordingly, the OR gate 141 usually straightly outputs the output of the CLK receiver 121 as the internal clock ICLK.

The peripheral circuit unit 110 includes various kinds of circuits necessary to write data into and read data from a memory cell array 101. In FIG. 1, only elements closely relating to the present invention are shown. A mode register 112 included in the peripheral circuit unit 110 can write data when a predetermined command is supplied from the command terminal CMD. An operation mode of the semiconductor memory device is selected based on a code written in this mode register 112. The address terminal ADD supplies a code to be written into the mode register 112, to the mode register 112.

When a predetermined code is set to the mode register 112, the switching signal generating circuit 111 is activated, and the switching signal TCLKE becomes at a high level. As described above, the switching signal TCLKE is supplied to the AND gate 142.

The peripheral circuit unit 110 includes a reference voltage generating circuit 113 that generates a reference voltage Vref0. The circuit is designed such that the reference voltage Vref0 becomes a desired value (for example, 1.2 V). A slight variation in the reference voltage cannot be avoided due to a production tolerance. However, because the reference voltage Vref0 becomes a reference voltage of various kinds of internal voltage such as a word line level, a permissible error is very small.

Therefore, a fuse circuit 114 is provided in the peripheral circuit unit 110. When a predetermined fuse included in the fuse circuit 114 is disconnected, a level of the reference voltage Vref0 can be fine adjusted. In other words, the value of an adjustment signal cont changes corresponding to a disconnection pattern of a fuse included in the fuse circuit 114. By supplying the adjustment signal cont to the reference voltage generating circuit 113, the level of the reference voltage Vref0 can be adjusted. When the fuse is disconnected, the value of the generated adjustment signal cont is fixed permanently. Consequently, the reference voltage Vref0 can be maintained at a correct value.

The reference voltage Vref0 generated by the reference voltage generating circuit 113 can be referenced from the outside via the reference voltage terminal Vref.

An artificial adjusting circuit 115 that temporarily generates the adjustment signal cont is provided in the peripheral circuit unit 110. In making the artificial adjusting circuit 115 generate the adjustment signal cont, a predetermined code is set to the mode register 112, and then, a code corresponding to the adjustment signal cont to be generated is input. In this case, the code can be also input via the address terminal ADD.

A fuse circuit 116 for replacing the address is provided in the peripheral circuit unit 110. This fuse is used to replace a defective cell included in the memory cell array 101 with a redundant memory cell array 102.

The above explains the configuration of main parts of the semiconductor memory device according to the present embodiment.

A method of testing a semiconductor memory device according to the present embodiment is explained next.

Figure 2:
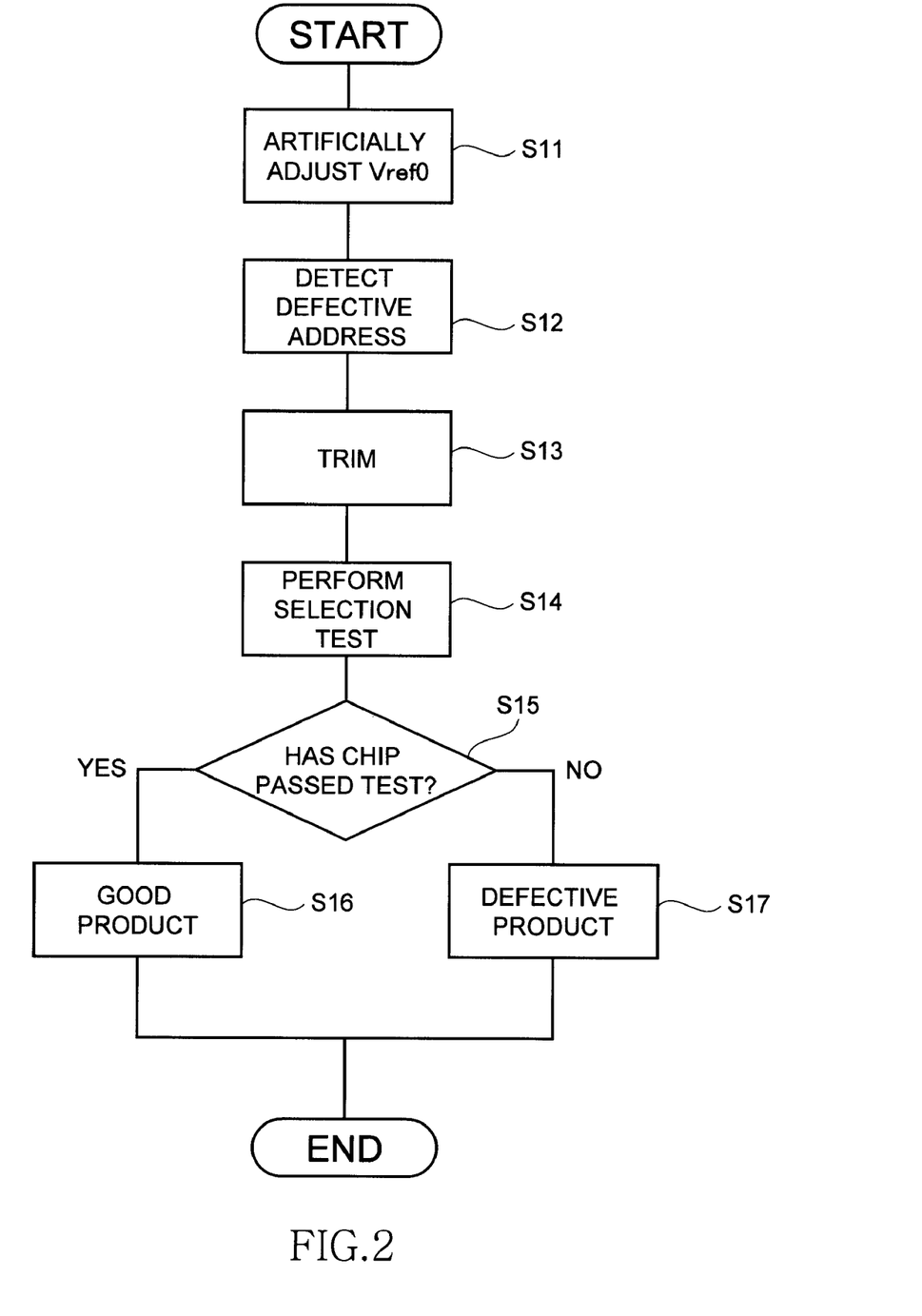
FIG. 2 is a flowchart showing a main flow of the method of testing a semiconductor memory device according to the present embodiment.

FIG. 2 is a flowchart showing a main flow of the method of testing a semiconductor memory device according to the present embodiment.

As shown in FIG. 2, first, the reference voltage Vref0 is artificially adjusted (step S11). This step has a very important characteristic in the present invention, and its details are described later. After the artificial adjustment is completed, the reference voltage Vref0 generated by the reference voltage generating circuit 113 becomes a value substantially equal to a design value. A state after trimming the fuse circuit 114 is artificially realized.

Next, by actually writing and reading data, a detection of a defective address, that is, an operation test is performed (step S12). A defective address detected by this operation is temporarily stored within a tester, and the fuse circuit 116 is trimmed based on information concerning the defective address (step S13). At this time, the fuse circuit 114 is also trimmed.

The trimming can be performed by irradiating a laser beam, or by applying a large current. With this arrangement, a defective cell included in the memory cell array 101 is replaced by a normal cell within the redundant memory cell array 102, thereby saving the defective address. A permanent fine adjustment of the reference voltage Vref0 is completed by trimming the fuse circuit 114.

After the adjustment of the semiconductor memory device is completed, data is written and read again to perform a selection test (step S14). As a result, a chip which has passed the selection test (step S15: YES) is handled as a good product (step S16), and a chip which has not passed the selection test (step S15: NO) is handled as a defective product (step S17).

The above explains a broad flow of the method of testing a semiconductor memory device according to the present embodiment.

Figure 3:
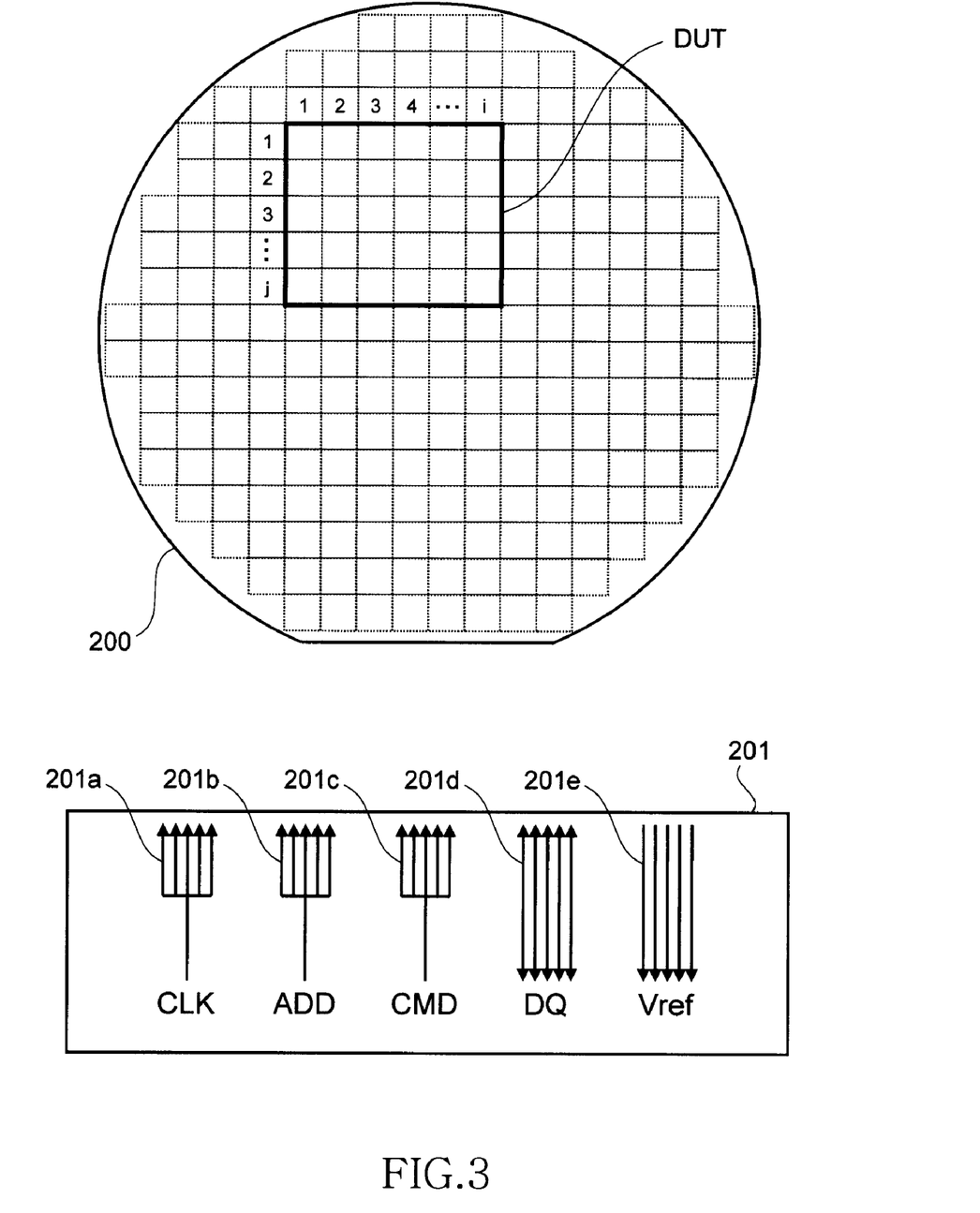
FIG. 3 shows a semiconductor wafer and a probe card to test the semiconductor wafer.

This test is performed in parallel to plural semiconductor memory devices (chips) in a state of semiconductor wafer. In other words, as shown in FIG. 3, out of semiconductor memory devices included in a semiconductor wafer 200, the test is performed in parallel to i×j semiconductor memory devices. The i×j semiconductor memory devices to be tested in parallel are called a DUT (Device Under Test). The number of DUTs depends on a configuration of a probe card 201 provided in the tester. For example, 180 semiconductor memory devices are tested in parallel.

The probe card 201 has many probes to be contacted to terminals provided on a semiconductor memory device to be tested. As shown in FIG. 3, a probe 201a to be connected to the clock terminal CLK, a probe 201b to be connected to the address terminal ADD, and a probe 201c to be connected to a command terminal CMD are connected in common to the chips. This arrangement is made because individual clock signals, individual address signals, and individual commands are not required to be supplied to corresponding semiconductor memory devices in the operation test for detecting a defective address (see step S12) and the selection test for detecting a defective product (see step S14). These signals can be supplied in common to all the semiconductor memory devices.

On the other hand, data to be input and output is necessary for each chip. Therefore, a probe 201d to be connected to the data input and output terminal DQ is not connected in common, and is individually connected to each chip. In order to individually reference the reference voltage Vref0, a probe 201e to be connected to the reference voltage terminal Vref is not connected in common and is individually connected to each chip.

When the probe card 201 having the above configuration is used, individual commands can be input to chips, and individual codes can be input to corresponding chips in the semiconductor memory device according to the present embodiment, although the commands and codes cannot be input individually according to the conventional practice. This individual control of each chip is performed by artificially adjusting the reference voltage Vref0 at step S11.

Figure 4:
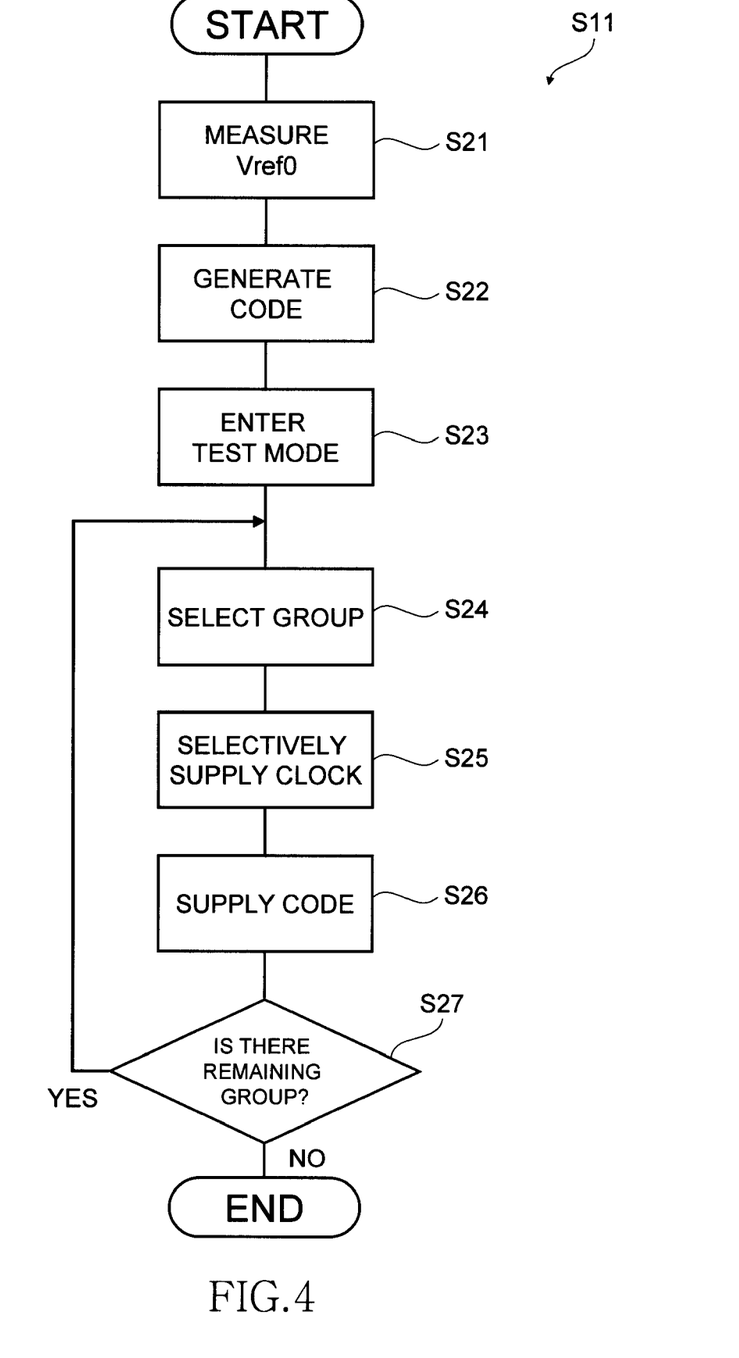
FIG. 4 is a flowchart for explaining in further detail the artificial adjustment (step S11) of the reference voltage Vref0.

FIG. 4 is a flowchart for explaining in further detail the artificial adjustment (step S11) of the reference voltage Vref0.

In the artificial adjustment of the reference voltage Vref0, the reference voltage Vref0 is measured via the reference voltage terminal Vref (step S21). As shown in FIG. 3, probes to be connected to the reference voltage terminal Vref are individually connected to each chip, and therefore, the reference voltage Vref0 is measured for each chip.

Figure 5:
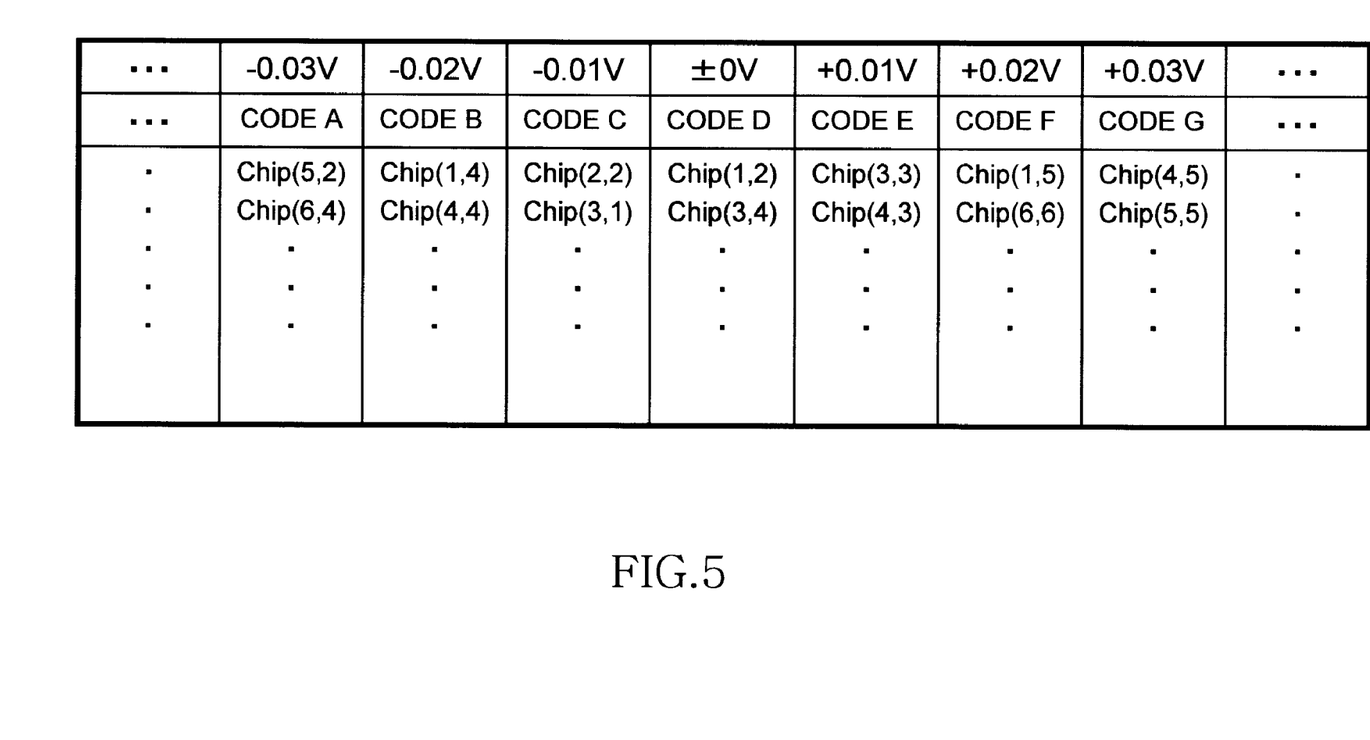
FIG. 5 schematically shows a state that semiconductor memory devices are grouped for each code to be set.

A code to be supplied to the artificial adjusting circuit 115 is generated based on a result of measuring the reference voltage Vref0 (step S22). A generated code is uniquely determined according to the result of measuring the reference voltage Vref0. For example, when the measured reference voltage Vref0 is higher than the design value by 0.01 V, a "code D" shown in FIG. 5 is allocated to fine adjust the reference voltage Vref0 to become lower by 0.01 V. Similarly, when the measured reference voltage Vref0 is lower than the design value by 0.02 V, a "code G" shown in FIG. 5 is allocated to fine adjust the reference voltage Vref0 to become higher by 0.02 V.

When the above codes are generated for all semiconductor memory devices, the i×j semiconductor memory devices are classified into plural groups depending on the result of measuring a reference voltage Vref0, as shown in FIG. 5. Because deviations of the reference voltage Vref0 are substantially equal in the semiconductor memory devices belonging to the same group, the artificial adjustment of the reference voltage Vref0 can be performed in common, as explained below.

Figure 6:
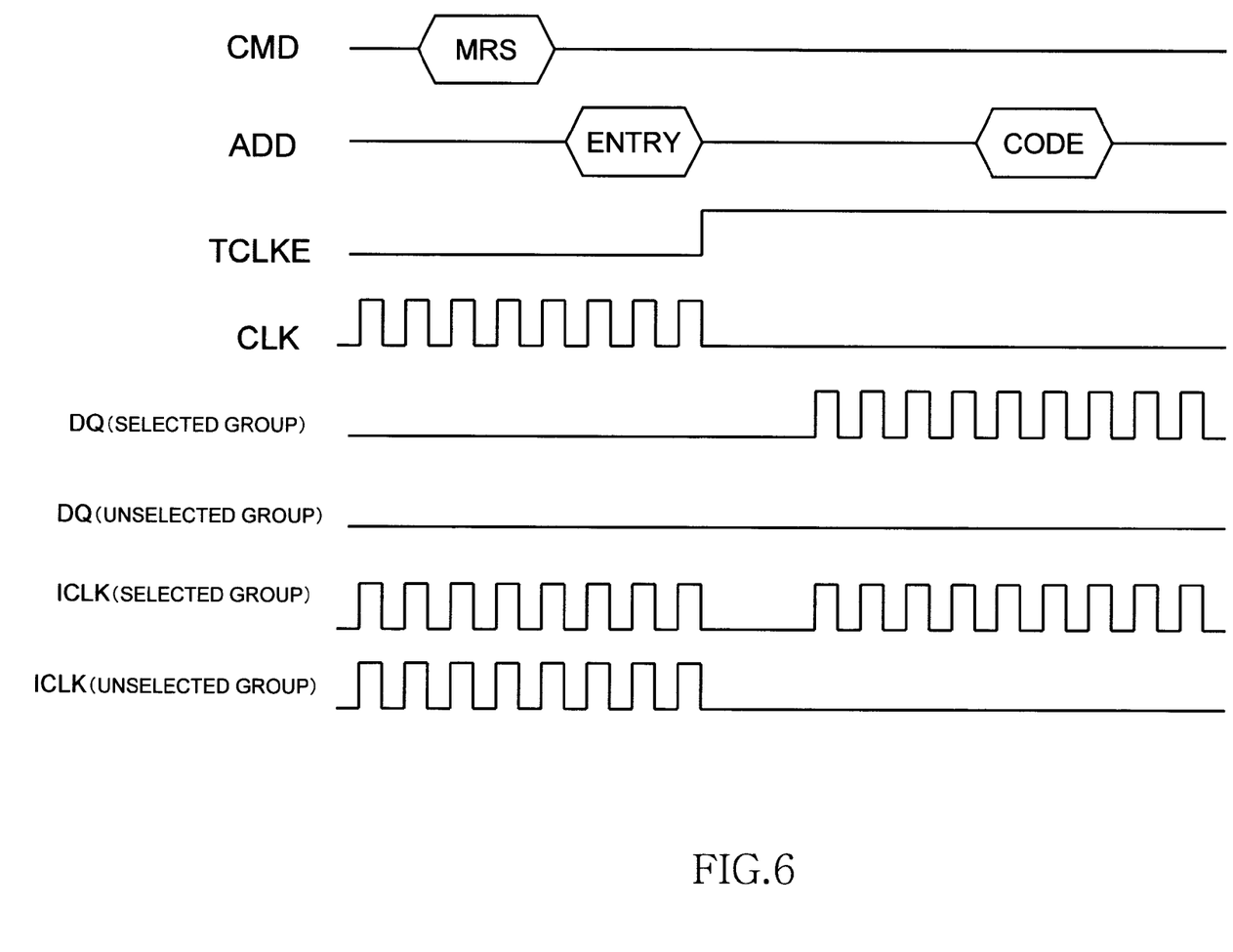
FIG. 6 is a timing diagram for explaining a method of setting an artificial adjusting circuit.

Next, a predetermined command (mode register set) is issued via the command terminal CMD, and thereafter, a predetermined code is set to the mode register 112 via the address terminal ADD, as shown in a timing diagram in FIG. 6, thereby activating the switching signal generating circuit 111 (step S23). As described above, the probes to be connected to the address terminal ADD and the command terminal CMD are connected in common to the chips. Therefore, the switching signal generating circuits 111 within all the semiconductor memory devices are activated, and the switching signal TCLKE becomes at a high level. Accordingly, the mode becomes a test mode for artificially adjusting the reference voltage Vref0.

Next, a predetermined group is selected (step S24), and a clock signal is selectively supplied to the data input and output terminal DQ of the selected group (step S25). In this case, a clock signal is not supplied to the clock terminal CLK, and the clock terminal CLK is fixed to a low level. The data input and output terminals DQ of unselected groups are also fixed to a low level.

With this arrangement, in the selected group, a clock signal supplied via the data input and output terminal DQ is reproduced via the AND gate 142 and the OR gate 141. Therefore, the internal clock ICLK normally clocks as shown in FIG. 6. On the other hand, in the unselected groups, both the clock terminal CLK and the data input and output terminal DQ are fixed to the low level. Therefore, as shown in FIG. 6, the internal clock ICLK becomes in the stopped state. In other words, while the selected group becomes in the state of being able to receive the code synchronously with the internal clock ICLK, the unselected groups become in the state of being unable to receive the code.

In this state, the code allocated to the selected group is supplied via the address terminal ADD (step S26). As described above, the probes to be connected to the address terminal ADD are connected in common to the chips. Therefore, the same code is supplied to all semiconductor memory devices. However, the unselected groups cannot receive the code due to the stop of the internal clock ICLK, and the supplied code is supplied to only the artificial adjusting circuit 115 of the selected group.

Accordingly, the reference voltage Vref0 is correctly artificially adjusted within the semiconductor memory devices belonging to the selected group. For example, the reference voltage Vref0 is fine-adjusted to become lower by 0.01 V in the semiconductor memory device to which the "code D" shown in FIG. 5 is allocated. This process is performed for each group (steps S24 to S27). After the fine adjustment is completed for all groups (step S27: YES), a series of artificial adjustment process (step S11) is completed.

Thereafter, the test as described with reference to FIG. 2 is performed. In this case, in detecting a defective address at step S12, the reference voltage Vref0 is not applied from the outside like in the conventional practice. The reference voltage Vref0 is internally generated under the actual operation condition. In other words, because the operation test is performed using the same voltage as the reference voltage Vref0 after the fine adjustment obtained by trimming, the test can be performed remarkably correctly.

As explained above, the semiconductor memory device according to the present embodiment can receive a clock signal from the data input and output terminal DQ, by setting the switching signal TCLKE to a high level. Therefore, even when the general probe card 201 for connecting the clock terminal, the address terminal, and the command terminal, respectively in common to plural chips as shown in FIG. 3, the artificial adjusting circuit 115 can be individually set.

Accordingly, various kinds of test and various kinds of adjusting operation can be performed using exactly the same voltage as the reference voltage Vref0 after the fine adjustment obtained by trimming. Consequently, various kinds of function test such as a detection of a defective address can be performed correctly. Further, various kinds of internal setting such as the adjustment of a self refresh timer cycle, the setting of a substrate potential, and the setting of a word line potential can be performed correctly.

Therefore, it is possible to correctly perform the operation test of a semiconductor memory device to which a slight error of the reference voltage Vref0 can give a substantial influence, particularly, a synchronous DRAM having a low voltage and a large capacity.

The present invention is in no way limited to the aforementioned embodiments, but rather various modifications are possible within the scope of the invention as recited in the claims, and naturally these modifications are included within the scope of the invention.

Figure 7:
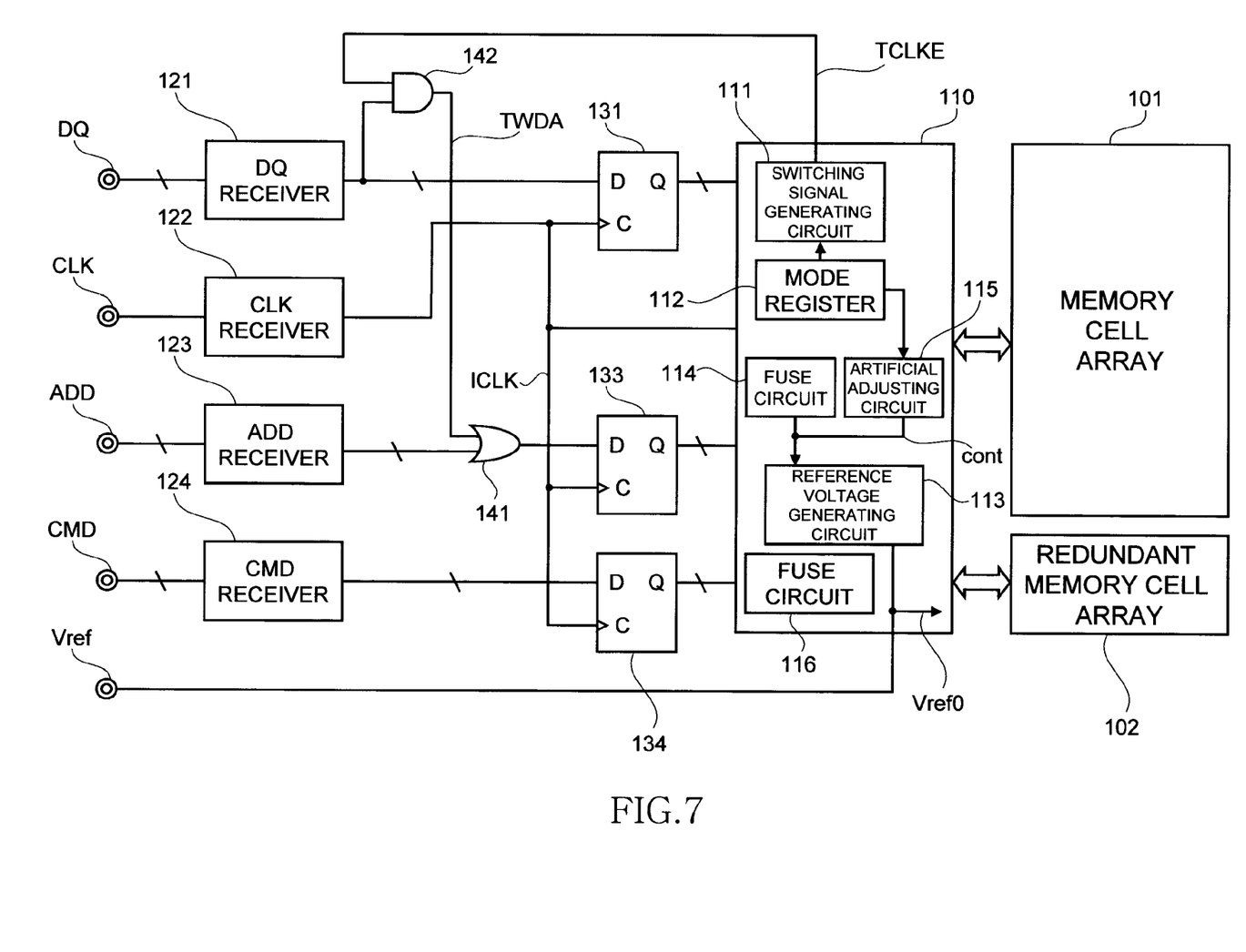
FIG. 7 shows a configuration of main parts of a semiconductor memory device according to one modification of the present invention.

For example, in the above embodiment, a clock signal can be received from the data input and output terminal DQ, by activating the switching signal TCLKE. When the OR gate 141 is disposed on the path of the address signal as shown in FIG. 7, an address signal can be input from the data input and output terminal DQ. In this case, a code is selectively supplied to the input and output terminal DQ of the selected group, in the input of a code at step S26. With this arrangement, a code can be selectively supplied to the artificial adjusting circuit 115 of the selected group. However, in this case, the number of the data input and output terminal DQ needs to be equal to or larger than the number of bits necessary to input the code.

Figure 8:
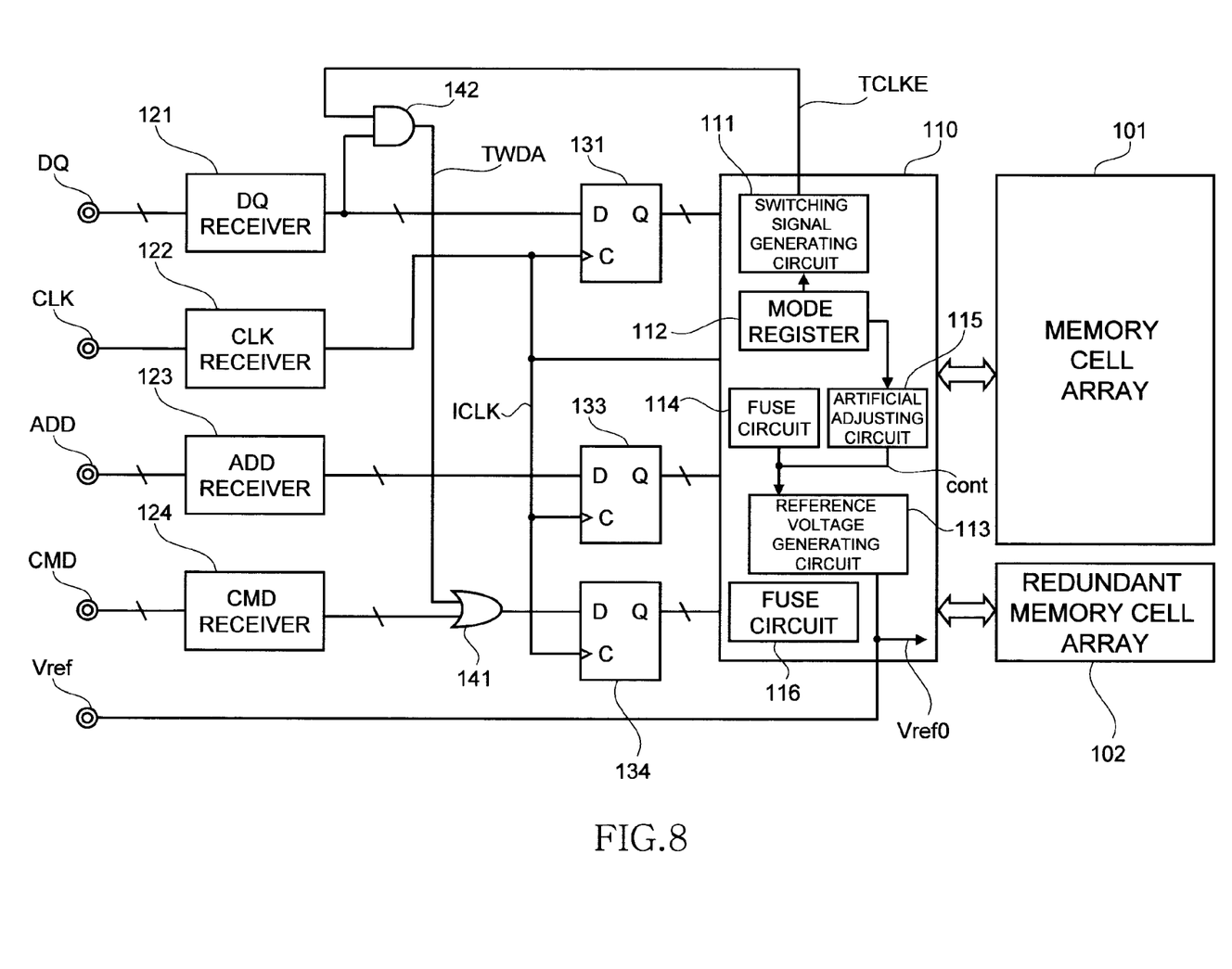
FIG. 8 shows a configuration of main parts of a semiconductor memory device according to another modification of the present invention.

As shown in FIG. 8, when the OR gate 141 is disposed on the path of a command, the command can be also input from the data input and output terminal DQ. However, in this case, the number of the data input and output terminal DQ also needs to be equal to or larger than the number of bits necessary to input the command. The configurations of circuits shown in FIG. 7 and FIG. 8 become slightly more complex than that of the embodiment shown in FIG. 1.

The semiconductor memory device according to the present embodiment includes the fuse circuit 114. The adjustment signal cont is permanently generated by trimming the fuse circuit 114. However, so long as the adjustment signal cont can be permanently generated, other nonvolatile memory circuit such as a ROM circuit can be used.

Further, the present invention is not limited to DRAMs, and is also applicable to other semiconductor memory devices.

What is claimed is:

1. A method of performing operational testing of a plurality of semiconductor memory devices, each having a data input and output terminal, a clock terminal, an address terminal, and a command terminal, in a state that the clock terminal, the address terminal, and the command terminal are connected in common among the plurality of semiconductor memory devices, wherein the test method comprises:
    a first step of measuring a reference voltage generated inside the semiconductor memory device;
    a second step of generating a code for temporarily adjusting the reference voltage, based on a result of measuring the reference voltage;
    a third step of entering a test mode in which the semiconductor memory device is configured to receive any one of a clock signal, an address signal, and a command, from the data input and output terminal; and
    a fourth step of supplying the code via the data input and output terminal or the address terminal, in the test mode.

2. The method of testing a semiconductor memory device as claimed in claim 1, further comprising a fifth step of writing data to and reading data from the plurality of semiconductor memory devices, after performing the fourth step.

3. The method of testing a semiconductor memory device as claimed in claim 2, further comprising a sixth step of writing data to a nonvolatile memory circuit for permanently adjusting the reference voltage, after performing the fifth step.

4. The method of testing a semiconductor memory device as claimed in claim 3, wherein the nonvolatile memory circuit is a fuse circuit, and the fuse circuit is disconnected at the sixth step.

5. The method of testing a semiconductor memory device as claimed in claim 1, wherein the plurality of semiconductor memory devices are formed on the same semiconductor wafer.

6. A method of performing operational testing of a plurality of semiconductor memory devices, each having a data input and output terminal, a clock terminal, an address terminal, and a command terminal, in a state that the clock terminal the address terminal, and the command terminal are connected in common among the plurality of semiconductor memory devices, wherein the test method comprises:
   a first step of measuring a reference voltage generated inside the semiconductor memory device;
   a second step of generating a code for temporarily adjusting the reference voltage, based on a result of measuring the reference voltage;
   a third step of entering a test mode in which the semiconductor memory device is configured to receive any one of a clock signal, an address signal, and a command, from the data out put terminal; and
   a fourth step of supplying the code via the data input and output terminal or the address terminal, in a state of entering the test mode,
   wherein in the fourth step, the code is supplied in common to the plurality of semiconductor memory devices via the address terminal, the clock signal is selectively supplied to a part of the plurality of semiconductor memory devices via the data input and output terminal, and a supply of a clock signal to the clock terminal provided in the plurality of semiconductor memory devices is stopped.

7. The method of testing a semiconductor memory device as claimed in claim 6, further comprising a fifth step of writing data to and reading data from the plurality of semiconductor memory devices, after performing the fourth step.

8. The method of testing a semiconductor memory device as claimed in claim 7, further comprising a sixth step of writing data to a nonvolatile memory circuit for permanently adjusting the reference voltage, after performing the fifth step.

9. The method of testing a semiconductor memory device as claimed in claim 8, wherein the nonvolatile memory circuit is a fuse circuit, and the fuse circuit is disconnected at the sixth step.

10. A method of testing of a plurality of semiconductor devices, each of the devices having a data input and output terminal, a clock terminal, an address terminal, and a command terminal, wherein the test method comprises:
   executing a first test mode, in which the clock terminal, the address terminal, and the command terminal are connected in common among the plurality of devices, respectively, the data input and output terminal is not connected in common among the devices, and the devices are configured to control in common via the clock terminal, the address terminal, and the command terminal; and
   executing a second test mode, in which the clock terminal, the address terminal, and the command terminal are connected in common among the plurality of devices, respectively, the data input and output terminal is not connected in common among the devices, a selected one or ones of the devices are configured to control via the data input and output terminal of each of the selected one or ones of the devices, and unselected one or ones of the device are configured not to control.

11. The method as claimed in claim 10, wherein in the first test mode the devices are configured to receive a clock signal, an address signal, and a command in common; and in the second test mode the selected one or ones of the devices are configured to receive at least one of the clock signal, the address signal, and the command, and the unselected one or ones of the devices are configured not to receive at least one of the clock signal, the address signal, and the command.

12. The method as claimed in claim 10, wherein in the second test mode the clock signal is supplied to the selected one or ones of the devices via the data input and output terminal of each of the selected one or ones of the devices and a supply of a clock signal to the one or ones of the devices via the clock terminal is stopped.

13. The method as claimed in claim 10, wherein in the second test mode the address signal is supplied to the selected one or ones of the devices via the data input and output terminal of each of the selected one or ones of the devices and a supply of an address signal to the one or ones of the devices via the address terminal is stopped.

14. The method as claimed in claim 10, wherein in the second test mode the command is supplied to the selected one or ones of the devices via the data input and output terminal of each of the selected one or ones of the devices and a supply of a command to the one or ones of the devices via the command terminal is stopped.

15. The method as claimed in claim 10, wherein the first test mode and the second test mode are selected based on a predetermined code inputted to the device via the address terminal and command terminal of each of the devices.

16. The method as claimed in claim 10, wherein the first test mode includes measuring a reference voltage generated inside each of the devices, and the second test mode includes supplying the selected one or ones of the devices with a predetermined code corresponding to the reference voltage of the selected one or ones of the devices.

17. The method as claimed in claim 10, wherein the first test mode is a first step and the second test mode is a second step executed after the first step, and the method including a third step executed after the first step, wherein in the third step the devices are configured to control in common.

18. The method as claimed in claim 17, wherein the first step includes measuring a reference voltage generated inside each of the devices, the second step includes supplying the selected one or ones of the devices with a predetermined code corresponding to the reference voltage of the selected one or ones of the devices, and the third step includes writing data to and reading data from the devices.

* * * * *